(12) United States Patent
Gellrich et al.

(10) Patent No.: US 8,009,343 B2
(45) Date of Patent: Aug. 30, 2011

(54) OPTICAL IMAGING DEVICE HAVING AT LEAST ONE SYSTEM DIAPHRAGM

(75) Inventors: Bernhard Gellrich, Aalen (DE); Thomas Bischoff, Aalen (DE); Hermann Bieg, Aalen (DE); Martin Huber, Unterentfelden (CH); Francois Henzelin, Boncourt (CH); Gerhard Szekely, Wetzikon (CH); Uy-Liem Nguyen, Baden (CH); Martin E. Humphries, Bristol (GB)

(73) Assignee: Carl Zeiss SMT GmbH, Oberkochen (DE)

( * ) Notice: Subject to any disclaimer, the term of this patent is extended or adjusted under 35 U.S.C. 154(b) by 849 days.

(21) Appl. No.: 10/566,196

(22) PCT Filed: Jul. 2, 2004

(86) PCT No.: PCT/EP2004/007186
§ 371 (c)(1),
(2), (4) Date: Jun. 18, 2008

(87) PCT Pub. No.: WO2005/019878
PCT Pub. Date: Mar. 3, 2005

(65) Prior Publication Data
US 2009/0021820 A1    Jan. 22, 2009

(30) Foreign Application Priority Data
Aug. 1, 2003 (DE) .................. 103 35 215

(51) Int. Cl.
*G02B 27/72* (2006.01)

(52) U.S. Cl. .................. 359/234; 355/71
(58) Field of Classification Search .......... 359/233–236; 355/67, 71
See application file for complete search history.

(56) References Cited

U.S. PATENT DOCUMENTS

| 4,027,167 A | 5/1977 | Pollermann ............ 250/513 |
| 4,296,352 A | 10/1981 | Berlec et al. |
| 5,323,301 A * | 6/1994 | Kaufman ............... 362/287 |
| 5,552,925 A * | 9/1996 | Worley ................. 359/230 |
| 6,445,510 B1 | 9/2002 | Schuster et al. ........ 359/739 |

FOREIGN PATENT DOCUMENTS

| JP | 2153334 | 6/1990 |
| JP | 2001110710 | 4/2001 |
| JP | 2002318403 | 10/2002 |
| WO | WO 02/31870 A1 | 4/2002 |

OTHER PUBLICATIONS

Donald L. Klipstein (Jr), The Great Internet Light Bulb Book, Part I; Incandescent including halogen light bulbs. 1996, p. 1-9. found at http://members.misty.com/don/bulb1.html.

* cited by examiner

*Primary Examiner* — Stephone B Allen
*Assistant Examiner* — Jennifer L. Doak
(74) *Attorney, Agent, or Firm* — Wells St. John P.S.

(57) ABSTRACT

An optical imaging device (PL), in particular an objective for semiconductor lithography, is provided with at least one system diaphragm. The system diaphragm comprises a multiplicity of mobile plates, which are rotatably mounted. The plates have a spherical curvature.

36 Claims, 5 Drawing Sheets

OPTICAL IMAGING DEVICE HAVING AT LEAST ONE SYSTEM DIAPHRAGM

CROSS REFERENCE TO RELATED APPLICATION

This is a 35 U.S.C. §371 application of and claims priority to PCT International Application Number PCT/EP2004/007186, which was filed Jul. 2, 2004, and was published in German, and which was based on German Patent Application No. 10335215.5, filed Aug. 1, 2003, and the teachings of all the applications are incorporated herein by reference.

BACKGROUND OF THE INVENTION

1. Field of the Invention

The invention relates to an optical imaging device, in particular an objective for semiconductor lithography, having at least one system diaphragm, the system diaphragm comprising a multiplicity of mobile plates.

2. Description of the Related Art

The use of various types of diaphragms as system diaphragms in optical imaging devices is widely known. The delimitation of ray bundles by diaphragms is very important for carrying out the optical imaging. Diaphragms can influence or vary the diameter of the ray bundle. The optical imaging quality of the optical imaging device can thereby be substantially influenced and improved.

In semiconductor lithography optical systems, it is known to use iris diaphragms with a flat diaphragm plane. It may, however, be necessary for delimitation of the ray path to be provided for the different aperture widths at different positions along the optical axis. This has already been done by existing diaphragms, as explained below.

For example, DE 199 55 984 A1 discloses a diaphragm in which, beyond a certain aperture width, a further flat plate assembly delimits the ray path in a second position. The diaphragm comprises at least two diaphragms arranged at an axial distance from one another. A different diaphragm is respectively optically active as a function of the aperture diameter of the system diaphragm.

DE 199 55 984 A1 furthermore discloses a diaphragm whose plate assembly can be displaced along the optical axis. The plates are arranged between two rings mobile in rotation relative to each other, at least one of the rings being rotationally mobile. The plate assembly is respectively displaced or moved parallel in the axial direction.

DE 199 55 984 A1 also discloses a diaphragm whose plates are arranged in a conical fashion. The optically effective edge of the diaphragm can therefore be moved, for example over a conical peripheral surface or over a peripheral surface of a spherical cap shape. The plates arranged rotationally symmetrically with respect to the optical axis of the system diaphragm therefore move with a linear or semicircular dependency between the aperture diameter and the axial position in the light path of the imaging device. The disadvantage of such an arrangement is that the cone angle is greatly limited, and the ray path cannot therefore follow the optimal shape of a sphere. Added to this, there are significant friction problems which are caused by bending of the elastic plates.

WO 02/31870 discloses a projection system with aperture diaphragms, the aperture diaphragms being arranged in the vicinity of the pupil plane. At least one of the aperture diaphragms can be modified in its aperture diameter and moved in the axial direction.

It is likewise known from the previously disclosed solutions, for instance from DE 199 55 984 A1, that such diaphragms in lithography objectives contain rolling or sliding bearings. For example, the rotational bearing axes of the plates are mounted in a sliding or rolling fashion and/or the drive element, which moves the plates, is mounted in a sliding or rolling fashion and/or there are sliding or rolling bearings at the force drive point of the plates. Each of such bearings within a lithography objective then constitutes a problem. Sliding or rolling friction can create particles which contaminate the objective and therefore greatly compromise the imaging quality. Lubrication inside the objective can furthermore be highly problematic, although even unlubricated bearings represent a high risk as regards operating reliability.

SUMMARY OF THE INVENTION

It is therefore an object, of the present invention to provide a system diaphragm for delimiting the ray path in an optical imaging device, which resolves the disadvantages of the prior art and can be used in a small installation space, with virtually no friction of the plates occurring so as to avoid contamination on optical surfaces.

According to the invention, the object is achieved by the features of claim 1.

The inventive system diaphragm of an optical imaging device comprises spherically curved plates which are rotatably mounted. The rotational bearing axes of the plates are preferably directed at the center of curvature of a sphere, which in turn also determines the spherical curvature or shape of the plates. It is therefore possible for the light-determining edge of the system diaphragm to be moved along a spherically shaped plane when opening and closing. It is therefore possible to form a system diaphragm which, for different aperture widths and different positions along an optical axis of an optical imaging instrument, for example a projection objective, follows a curve which corresponds to a sphere and can enter or insert from the installation space into the cap of a sphere. When there is a small installation space, such a system diaphragm according to the invention can therefore be introduced into the concave surface of a mirror, a lens or a very narrow intermediate space between two lenses.

In a particularly preferred configuration, the plates are arranged mobile in an overlapping fashion on two spherical surfaces, whose centers of curvature are identical, in which case the two spherical surfaces preferably have a very small mutual separation A.

The system diaphragm comprises plates whose surfaces do not bear directly on one another, as in the diaphragms known from the prior art, but instead they are respectively arranged alternatively and with a spacing A of a few millimeters, preferably A<1 mm, on two spheres. The contactless closing and opening of the plates with respect to one another offers an enormous advantage because no friction, which might for example contaminate the projection objective with the resulting particles, occurs between two "contiguous" plates. There is furthermore no wearing of the plates used in the system diaphragm. The use of individually mounted plates thus affords the opportunity to make them, for example, from ceramic such as SISIC (reaction bonded silicon infiltrated silicon carbide). This in turn has very advantageous properties in respect of the system diaphragm. The plates can therefore be made lightweight and very stiff, and likewise produced in any desired shape.

In a preferred configuration of the invention, the plates are furthermore each rotationally mounted on the rotational bearing axis by means of solid state articulations in order to rotate the plates, the plates being movable by means of a drive ring, the drive ring being mounted rotatably about an optical axis via solid state articulations.

Parts to be moved in rotation are not mounted by sliding or rolling bearings, as is known from the prior art, but instead by solid state articulations according to the invention. With solid state articulations, small displacement distances can be achieved by elastic deformation of a resilient element. This offers substantial advantages, such as no sliding or rolling friction. It is therefore not possible, as when sliding or rolling bearings are used, for particles to be deposited on optical surfaces of optical imaging instruments and substantially impair the imaging quality. Another advantage is that solid state articulations can be computationally registered very accurately. Lubricants, which might possibly cover the surfaces of the optical elements and damage them, are therefore unnecessary.

Exemplary embodiments of the invention will be explained in more detail below with reference to the drawings.

DETAILED DESCRIPTION

Figure 1:
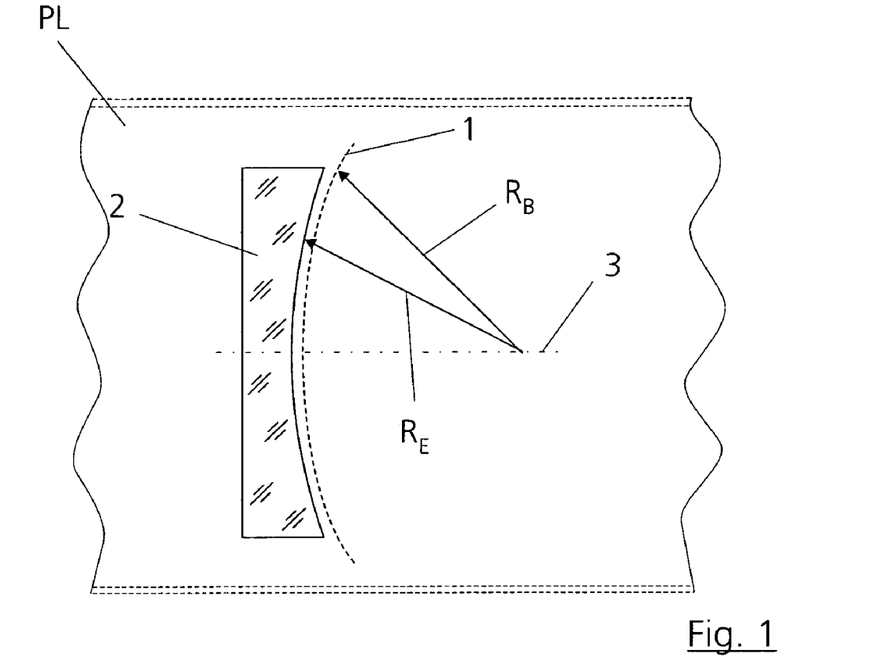
FIG. 1 shows an outline representation of an arrangement of a system diaphragm according to the invention in a concave surface of an optical element.

FIG. 1 shows how in an optical imaging device PL represented in outline and only partially, for example an objective for semiconductor lithography, a system diaphragm 1 according to the invention (here represented only by dashes) can be introduced into a concave surface of an optical element 2 so as to provide delimitation of the ray path at different positions along an optical axis 3 for different aperture widths in a space-saving way. The optical imaging device PL is designed as an objective for use in semiconductor lithography. $R_B$ denotes the radius of the system diaphragm 1 which, for example, is encountered when the system diaphragm 1 is fully closed. $R_E$ is the radius of that surface of the optical element 2 which corresponds with the surface of the system diaphragm 1.

Figure 2:
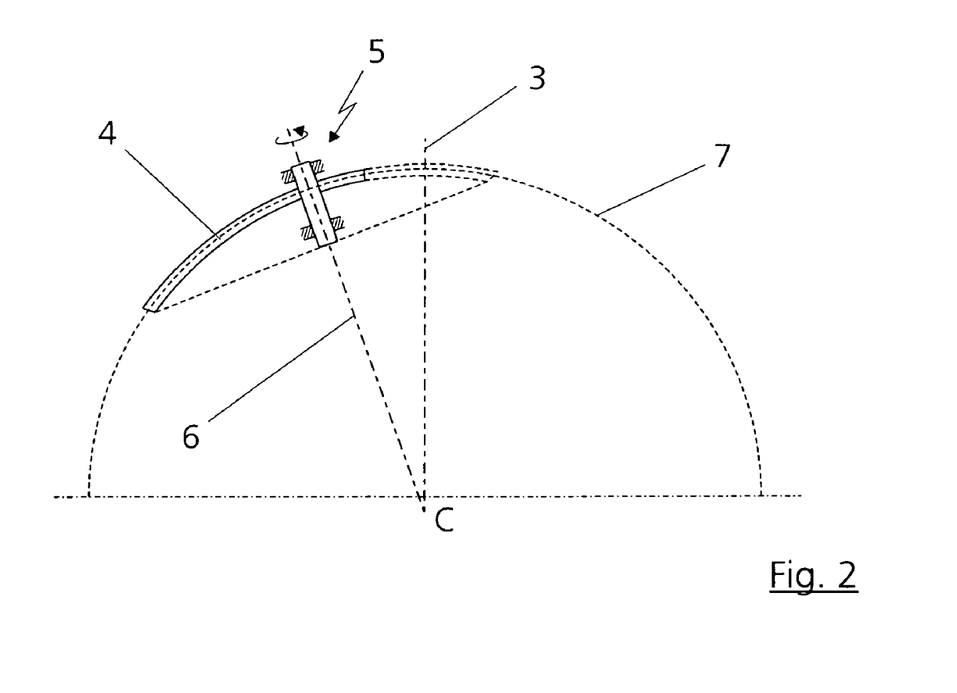
FIG. 2 shows an outline representation of an arrangement and embodiment of a plate of the system diaphragm according to the invention.

FIG. 2 represents a detail of the system diaphragm 1 according to the invention in outline, only one plate 4 being represented in cross section. The plate 4 is designed spherically in its curvature. A bearing 5, which is configured as a rotational bearing, is provided on the plate 4. The rotational bearing 5 has a rotational bearing axis 6 which is directed very accurately at a center of curvature C of a sphere 7, which is generated by the plate shape of the plate 4. Owing to the spherical configuration of the plate 4 and the alignment of the rotational bearing axis 6 with the center of curvature C, the plate 4 can now move in a spherical surface. The center of curvature C of the sphere 7 therefore corresponds to the middle of the optimal diaphragm surface.

Figure 3:
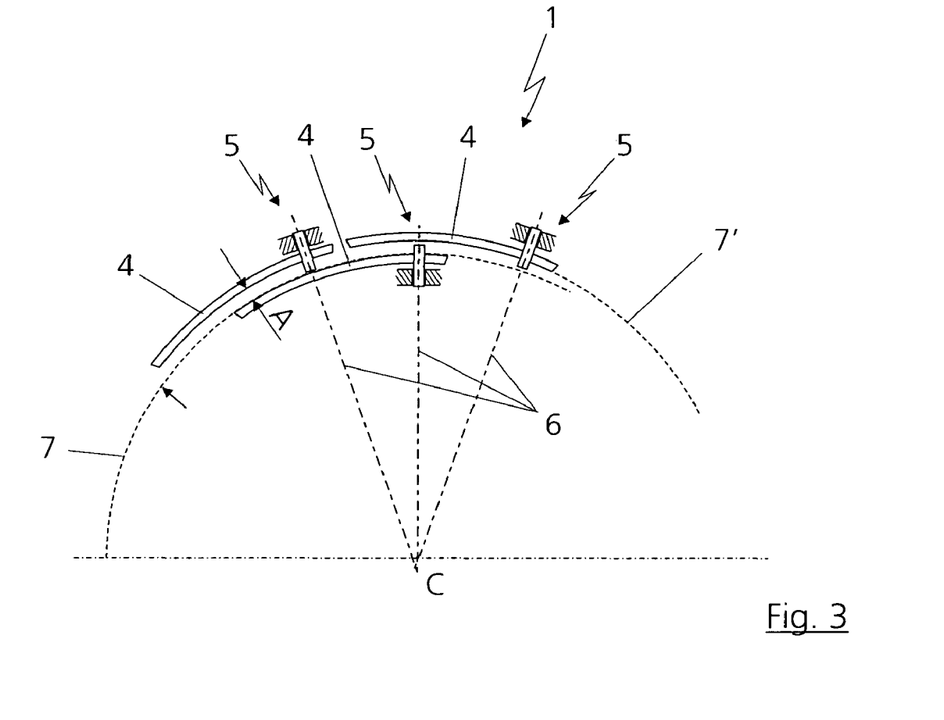
FIG. 3 shows an outline representation of an arrangement of a plurality of plates of the system diaphragm.

FIG. 3 represents a detail of the system diaphragm 1 with three plates 4 in outline. A single plate 4, however, is not capable of delimiting the ray path circularly. A certain number of plates 4 are usually necessary for this, which approximately describe a circle by their light-determining edges. Preferably, from eight to ten plates 4 may be used here for the circular ray path delimitation. It is of course also possible to use a greater or lesser number. With the plates already known from the prior art, it can be seen that they fully overlap when the diaphragm is being used. This, of course, must also be ensured in the system diaphragm 1 according to the invention.

By using individually mounted plates 4, not all the plates 4 being mounted in a plane, it is possible to make them from a material with high stiffness, for example ceramic, preferably SISIC (reaction bonded silicon infiltrated silicon carbide). This, in particular, has significant advantages since the plates 4 are lightweight and very stiff, and can be produced in any desired shape. The stiffness of the plates 4 can advantageously prevent the plates 4 from hanging down under their own weight, and consequently avoid contact between individual plates 4. Overlap of the individual plates 4 is therefore possible only if the plates 4 lie in two spherical surfaces 7 and 7', which are represented here by dashes, with a very small spacing A from one another. Care should also be taken that the rotational bearing axes 6 of the plates 4 are directed at the center of curvature C and the spheres 7 and 7' likewise have their center of curvature at C.

In order now to produce unique delimitation of the ray path, the plates 4 should move synchronously and the rotation axes or rotational bearing axes 6 of the rotational bearings 5, as already mentioned, should be aligned very accurately with the center of curvature C. The spacing A between the two spheres 7 and 7' should be kept as small as possible, for example only a few mm, preferably A<1 mm, while nevertheless ensuring absence of contact between the plates 4 when closing and opening the system diaphragm 1. This may advantageously be done by arranging the rotational bearings 5 with their rotational bearing axes 6 alternating in the direction of the center of curvature C and oppositely, as can be seen clearly in FIG. 3.

Figure 4:
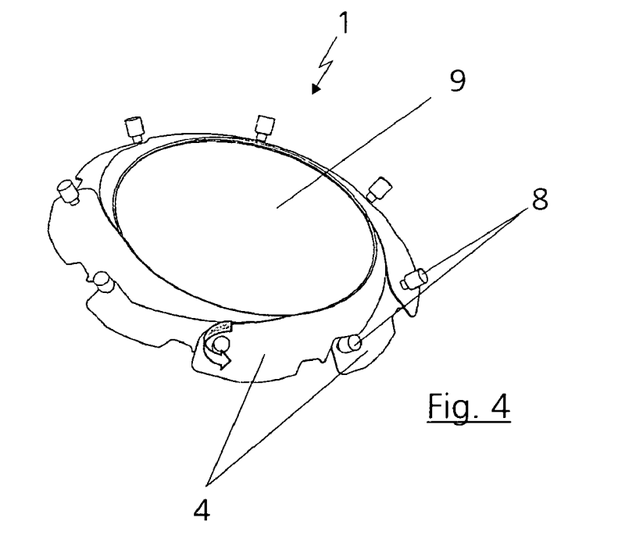
FIG. 4 shows a perspective representation of the system diaphragm according to the invention, the plates being mounted via solid state articulations.

FIG. 4 represents the system diaphragm 1 according to the invention in a perspective view. The system diaphragm 1 according to the invention makes it possible to rotate or move the plates 4 by using solid state articulations 8, and to adjust the diaphragm aperture 9 without the use of rolling or sliding bearings.

Figure 5:
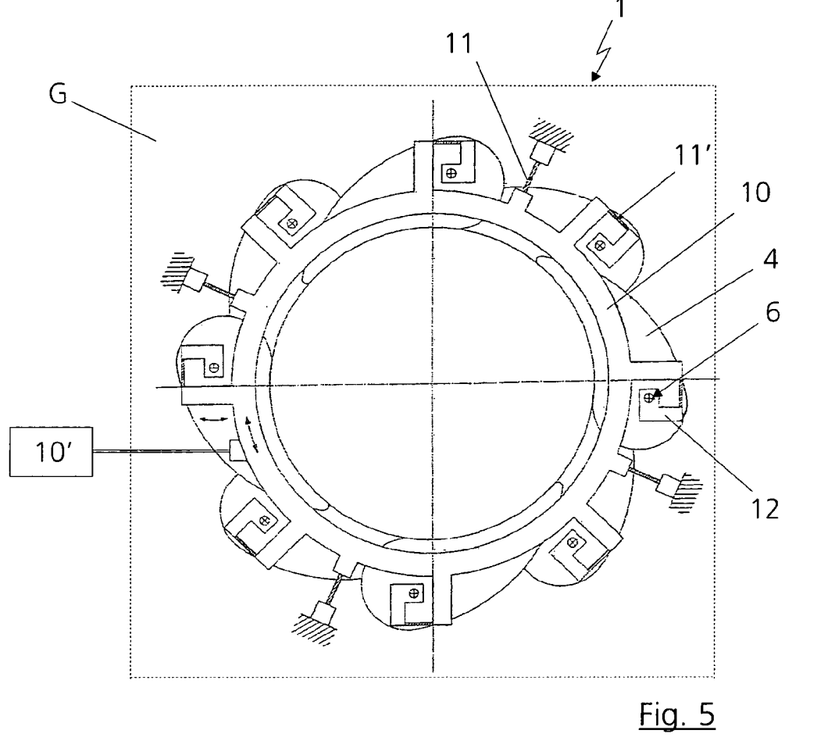
FIG. 5 shows an outline representation of the system diaphragm with the representation of a plate drive.

FIG. 5 represents the system diaphragm 1 of FIG. 4 in more detail. The plates 4 are rotationally mounted on their rotational bearing axis 6 by means of the solid state articulations 8, which can be seen clearly in FIG. 4. For example, cross-spring articulations may be used as solid state articulations 8 for this. The solid state articulations 8 can be computationally registered very accurately. If the load on the solid state articulations 8 does not exceed the long-term strength of the material, then the risk of such solid state articulations 8 failing is very low. Metal materials may be used for the solid state articulations 8, although care should be taken that the materials are UV-resistant. A drive ring or a synchronization ring 10 can be rotated through a few degrees about the optical axis 3 in the arrow direction by a hermetically sealed lever which extends outward. The drive ring 10 itself is mounted by means of solid state articulations 11 which are radially stiff and soft in the rotation direction. A drive element 12 is monolithic with the drive ring 10. The drive element 12 is connected to the plate 4 on the rotational bearing axis 6 of the plate 4. If the drive ring 10 is now moved about the optical axis 3, then the drive element 12 with the plate 4 rotates about the plate axis or rotational bearing axis 6. The solid state articulations 11 deform elastically, so that the drive torque increases.

Since the drive ring 10 is monolithic with the drive element 12 and has to rotate about the optical axis 3 for closing and opening the plates 4, solid state articulations 11' are likewise provided between the drive element 12 and the drive ring 10. The solid state articulation 11' may be formed as a single leaf spring. This, of course, does not constitute any restriction to one type of solid state articulation. The drive ring 10 should be made of a material which has a high stability under alternating load, so that the risk of failure remains low.

A drive unit 10' drives the drive ring 10, in a manner which is not represented in detail. The drive unit 10' may, for example, be a cam gear, an eccentric, a linear motor or a piezo motor, although this list is not meant to imply any limitation.

The drive unit 10' for moving the plates 4 is arranged outside a gas space G. The gas space G may be filled with various gases, for example helium or nitrogen. The drive unit 10' with moving parts subject to friction is replaceable while the system not exposed to friction, mounted only via solid state articulations 8, 11 and 11', is arranged in the optical gas space G. Arranging the drive unit 10' outside the gas space G is a significant advantage, since no contaminating substances can therefore be deposited on the optical surfaces.

Such mounting of the plates 4 with solid state articulations 8, 11 and 11' may of course also be used for diaphragm systems which move in a plane, and is not meant to be restricted merely to a diaphragm whose light-determining edge follows a spherical surface.

Figure 6:
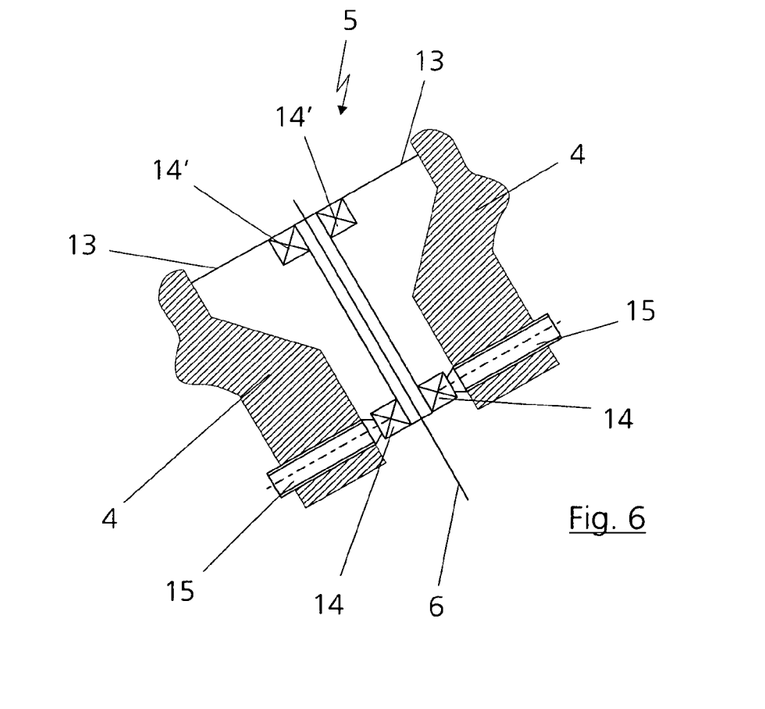
FIG. 6 shows an outline representation of one way of aligning the rotational bearing axes of the plates.

One way of aligning the rotational bearing axes 6 with the center of curvature C is to suspend the rotational bearing 5 in a diaphragm 13, as represented in cross section by FIG. 6. The suspension has a lower bearing element 14 and an upper bearing element 14'. The rotational bearing axis 6 lies between the bearing elements 14 and 14'. The diaphragm 13 is provided between the bearing elements 14, 14' and the plate 4. In order to align the rotational bearing axis 6 with the center of curvature C, the lower bearing element 14 may be set with the aid of adjusting screws 15. The diaphragm 13 is thus used as a ball joint. For example, three adjusting screws 15 arranged at 120° from one another may be used for the setting. By setting the adjusting screws 15 on the lower bearing element 14, it is thus possible to align the rotational bearing axis 6 accurately with the center of curvature C.

Figure 7:
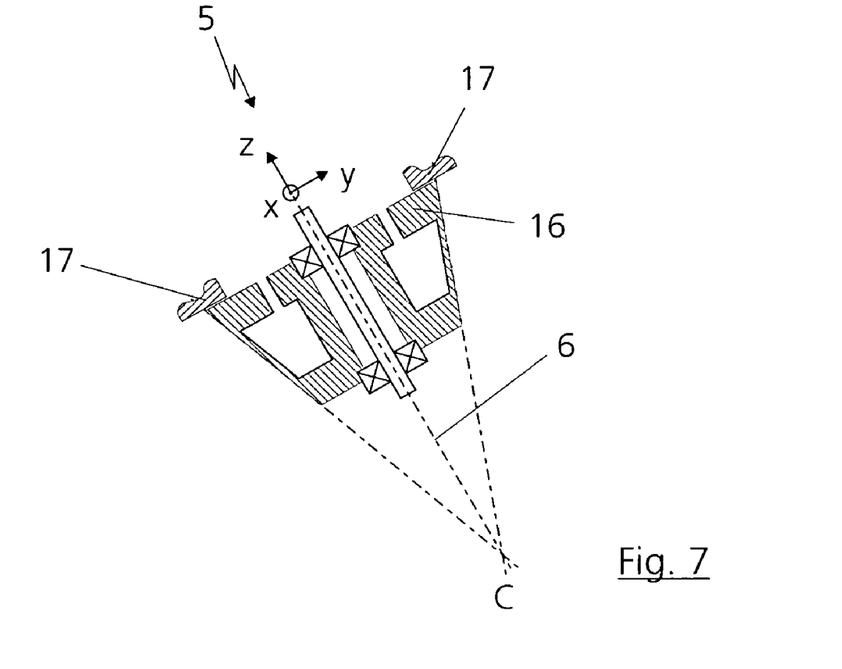
FIG. 7 shows an outline representation of an alternative way of aligning the rotational bearing axes of the plates.

Another way of adjusting the rotational bearing axis 6 with respect to the center of curvature C is to use a kinematic system. This is schematically represented in FIG. 7. Here, the rotational bearing 5 with its rotational bearing axis 6 is suspended on a solid state articulation 16. The solid state articulation 16 may be designed as a quadruple articulation. Holding elements 17 for holding the solid state articulation 16 are provided on the upper part of the solid state articulation 16. Owing to the advantageous use of a quadruple articulation, the swiveling movements of the rotational bearing 5 can be used in order to adjust the rotational bearing axis 6. Such kinematics are particularly suitable when one direction of the axis, in the exemplary embodiment the x axis, may be loosened because of manufacturing tolerances on the holding elements 17. Movement in the y direction is therefore sufficient. Kinematics represent another alternative when the kinematics or the rotational bearing 5 are made rotatable about the z axis. This is readily possible with a clamping instrument.

Figure 8:
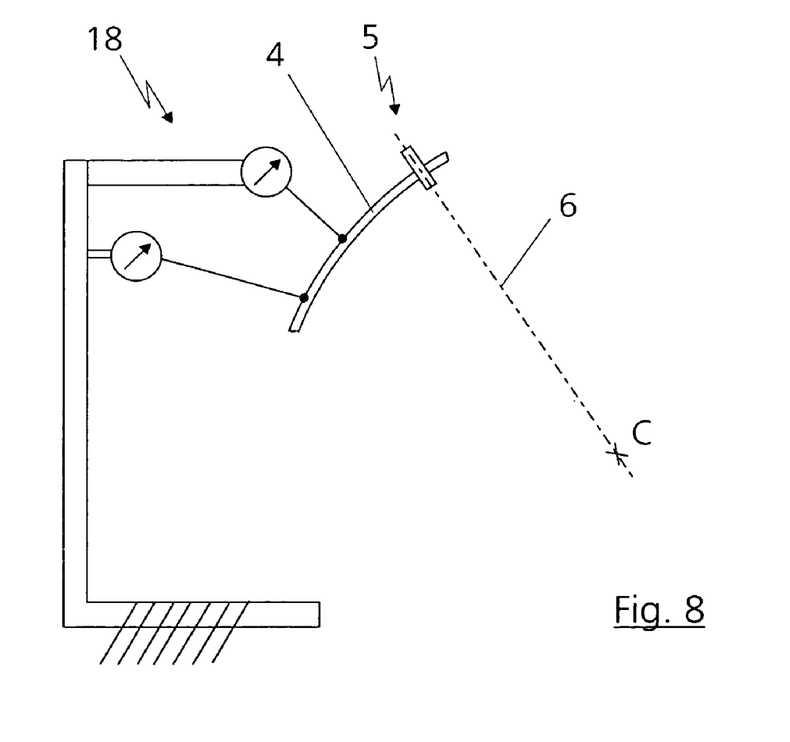
FIG. 8 shows an outline representation of one way of measuring during the alignment of the rotational bearing axes of the plates.
Figure 9:
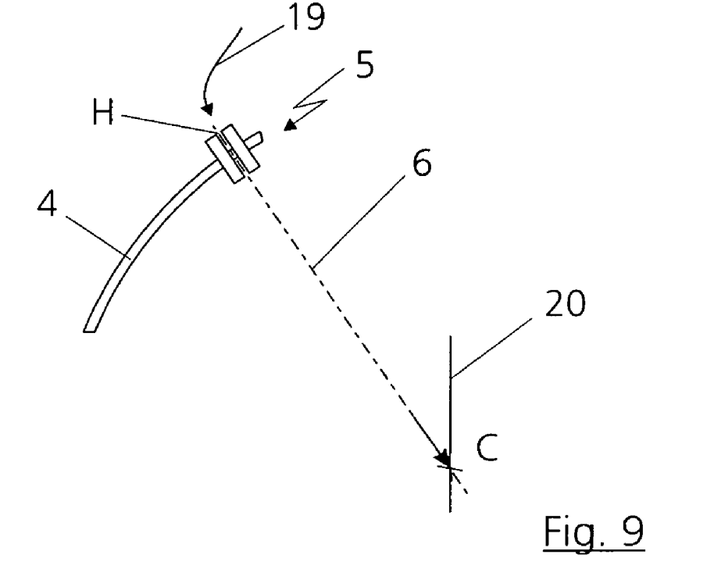
FIG. 9 shows an outline representation of an alternative way of measuring during the alignment of the rotational bearing axes of the plates.

FIGS. 8 and 9 show schematically represented measuring methods for when the rotational bearing axes 6 of the plates 4 are being aligned with the center of curvature C. A first option is provided by a tactile measuring method, as represented in FIG. 8. Here, it is important for the spherically designed plate 4 to be produced very accurately. The sphere may therefore be analyzed, for example, with 2 militron scanners 18. The exact radius of the spherical surface of the plate 4 can then be determined. With the plate 4 still arranged correctly with respect thereto in space, it is therefore possible to determine the center of curvature C directly. With the aid of the sphere, it is furthermore possible to align a, tool with a reference plane and with a rotation axis. Like the plate 4, the tool has a spherical shape. The plates 4 are placed against this prefabricated shape and suctioned or held by other fastening methods. The prefabricated shape is then aligned with the reference plane and the rotational bearing axis 6. After alignment, the plates 4 can therefore be measured up with the aid of the tool or prefabricated shape and positioned at the correct place. The advantage of tactile measurement is that it can be readily implemented with a mechanical tool, and that the mechanical tool is reusable. It is furthermore relatively inexpensive compared with other measuring methods.

FIG. 9 shows another schematic representation of an optical measuring method for aligning the rotational bearing axes 6 of the plates 4. The plate 4 is likewise held by a prefabricated shape or instrument here, so that the plate 4 is tiltable or movable. In order to be able to measure the center of curvature C directly in this case, a small recess H is made in the form of a hole in the plate 4 or in the bearing 5. With the aid of a laser beam 19, which passes through the small recess H, a point can be imaged on a screen 20. In order to define the center of curvature C, it is necessary for a laser beam 19 to pass through all the plates 4 or rotational bearings 5 so as to obtain imaging points on the screen 20. The imaging points should as far as possible give a small point cloud which lies close to the center of curvature C. If all the imaging points form the such a small point cloud, then the center of curvature C is determined using the optical measuring method. The optical measuring method is substantially more accurate than the tactile measuring method.

Figure 10:
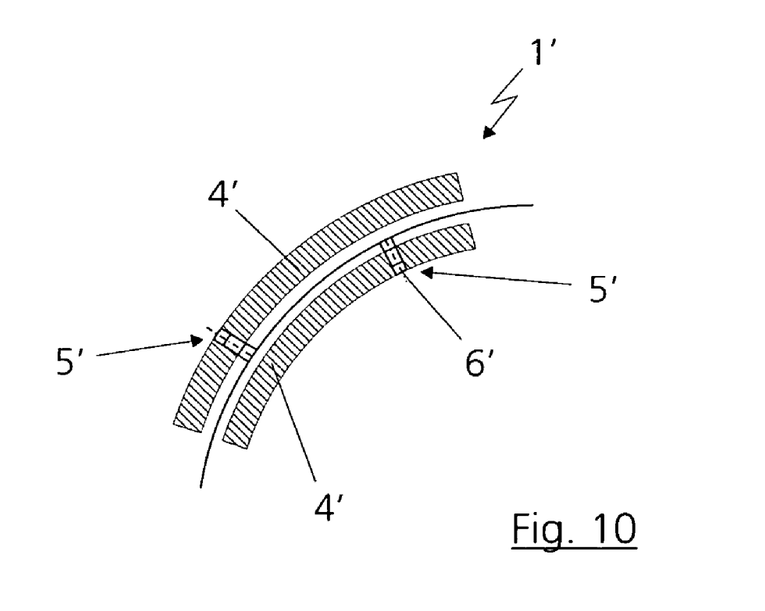
FIG. 10 shows an outline representation of an alternative embodiment of the system diaphragm according to the invention.

The stiff, comparatively thick plates 4 which are individually mounted and thus fixed in space, may also be replaced by extremely thin plates 4', as represented in outline in FIG. 10. Here, however, it is important for the plates 4' to be laminated. In this inventive possibility of configuring a system diaphragm 1', the plates 4' are likewise designed spherically in their curvature, and here again rotational bearing axes 6' of rotational bearings 5' must likewise be aligned with the center of curvature C of the sphere. A diaphragm system known from the prior art, which comprises an inner ring with a stationary axis, and an outer ring with a grooved ring and pins, may be provided for guiding the plates 4'. In order to guide the plates 4', both the stationary ring and the moving grooved ring are provided with a spherical surface. The advantage of this embodiment of the system diaphragm 1' is that there is a more accurate light-determining edge.

Very accurate maintenance of the spherical surface of the plates 4 and 4' is necessary in both variants or options for designing the system diaphragms 1 and 1'. Especially in the laminated variant according to FIG. 10 with the thin plates 4', it would otherwise be necessary to cope with intolerable friction effects. In particular, the method of "electrolytic deposition" on a shaped body is suitable for producing such plates 4 and 4'.

What is claimed is:

1. An optical imaging device, comprising:
at least one system diaphragm, the system diaphragm comprising a multiplicity of mobile plates, each mobile plate is rotatably mounted on a pivot axis, wherein each pivot axis extends through a center of curvature (C) of a sphere, and wherein the sphere is defined as a single spherical surface in which the mobile plates move relative to one another.

2. The optical imaging device as claimed in claim 1, further comprising an additional plate arranged mobile in an overlapping fashion with the multiplicity of mobile plates, the additional plate and the multiplicity of mobile plates comprising two different spherical surfaces whose centers of curvature (C) are identical.

3. The optical imaging device as claimed in claim 2, wherein the two different spherical surfaces have a mutual separation A of a few millimeters, preferably A<1 mm.

4. The optical imaging device as claimed in claim 1, wherein the plates have a high stiffness.

5. The optical imaging device as claimed in claim 1, wherein the plates are each rotationally mounted on the pivot axis by means of solid state articulations in order to rotate the plates.

6. The optical imaging device as claimed in claim 1, wherein the plates are movable by means of a drive ring, the drive ring being mounted rotatably about an optical axis via solid state articulations.

7. The optical imaging device as claimed in claim 6, wherein the solid state articulations are designed as solid state articulations which are radially stiff and soft in the rotation direction.

8. The optical imaging device as claimed in claim 6, wherein the drive ring is respectively connected to a plate via a drive element.

9. The optical imaging device as claimed in claim 8, wherein the drive element is connected to the drive ring via a solid state articulation.

10. The optical imaging device as claimed in claim 6, wherein the drive ring is monolithic with the drive element.

11. The optical imaging device as claimed in claim 6, wherein the drive ring is formed by a material which has a high stability under alternating load.

12. The optical imaging device as claimed in claim 1, wherein a drive unit for moving the plates is arranged outside a gas space (G).

13. The optical imaging device as claimed in claim 1, wherein rotational bearings are aligned with the pivot axes of the plates and are respectively suspended in a diaphragm, the pivot axes of the plates being alignable with the center of curvature (C).

14. The optical imaging device as claimed in claim 13, wherein control members are provided for aligning the pivot axes.

15. The optical imaging device as claimed in claim 13, wherein the rotational bearings are respectively suspended on a solid state articulation.

16. The optical imaging device as claimed in claim 15, wherein the solid state articulation is designed as a quadruple articulation.

17. The optical imaging device as claimed in claim 13, wherein tactile or optical measuring methods are provided for measurement when aligning pivot axes of the plates.

18. The optical imaging device as claimed in claim 1, wherein the pivot axis for each mobile plate extends through the mobile plate.

19. The optical imaging device as claimed in claim 1, wherein the mobile plates are configured to move between a closed position and an opened position, and wherein the configuration provides each mobile plate to be spaced from each other mobile plate during the movement between the closed and opened positions.

20. The optical imaging device as claimed in claim 1, wherein the mobile plates are configured to move between a closed position and an opened position, and wherein the configuration provides each mobile plate to move between the closed and opened positions without one mobile plate contacting any other mobile plate.

21. The optical imaging device as claimed in claim 1, wherein the optical imaging device comprises an objective for semiconductor lithography.

22. A variable system diaphragm for a microlithographic projection exposure apparatus having a multiplicity of plates held in a mobile fashion by means of solid state articulations; and
wherein each mobile plate is rotatably mounted on a pivot axis defined by the solid state articulations, wherein each pivot axis extends through a center of curvature (C) of a sphere, and wherein the sphere is defined as a single spherical surface in which the mobile plates move relative to one another.

23. The variable system diaphragm as claimed in claim 22, wherein the plates are mounted rotationally by the solid state articulations.

24. A variable system diaphragm having a multiplicity of mobile plates, the plates having a spherical curvature and being rotationally mounted, rotational bearing axes of the plates being aligned with a center of curvature (C) of a sphere, and the sphere determining a single surface on which the plates are mobile relative to one another.

25. The variable system diaphragm as claimed in claim 24, further comprising an additional plate arranged mobile in an overlapping fashion with the multiplicity of mobile plates, the additional plate and the multiplicity of mobile plates comprising two different spherical surfaces whose centers of curvature (C) are identical.

26. The diaphragm as claimed in claim 25, wherein the two different spherical surfaces have a mutual separation A of a few millimeters, preferably A<1 mm.

27. A projection objective in semiconductor lithography having optical elements, at least one variable system diaphragm for a microlithographic projection exposure apparatus being provided for introduction into a concave surface of an optical element, the diaphragm following a curved surface; and
wherein the diaphragm comprises a plurality of mobile plates, each mobile plate is rotatably mounted on a pivot axis, wherein each pivot axis extends through a center of curvature (C) of a sphere, and wherein the sphere is defined as a single spherical surface in which the mobile plates move relative to one another.

28. The projection objective as claimed in claim 27, wherein the diaphragm follows a spherically curved surface.

29. The projection objective as claimed in claim 27, further comprising an additional plate arranged mobile in an overlapping fashion with the plurality of mobile plates, the additional plate and the plurality of mobile plates comprising two different spherical surfaces whose centers of curvature (C) are identical.

30. The projection objective as claimed in claim 27, wherein the plates are mounted rotationally by solid state articulations.

31. An optical imaging device comprising:
   at least one system diaphragm, the system diaphragm comprising a multiplicity of mobile plates, each mobile plate is rotatably mounted on a pivot axis, wherein the pivot axis extends through a center of curvature (C) of a sphere, and wherein the sphere is defined as a surface in which the mobile plates move relative to one another; and
   wherein at least two of the mobile plates are arranged to rotate on respective pivot axes in an overlapping configuration on two different spherical surfaces, the two different spherical surfaces having an identical center of curvature (C).

32. The optical imaging device as claimed in claim 31, wherein the two different spherical surfaces are separated by a spatial distance ranging from less than 1 mm to a few millimeters.

33. An optical imaging device, in particular an objective for semiconductor lithography, having at least one system diaphragm, the system diaphragm comprising a multiplicity of mobile plates which are rotatably mounted, wherein the plates have a spherical curvature; and
   wherein the mobile plates are movable by means of a drive ring, the drive ring being mounted rotatably about an optical axis via solid state articulations.

34. An optical imaging device, in particular an objective for semiconductor lithography, having at least one system diaphragm, the system diaphragm comprising a multiplicity of mobile plates which are rotatably mounted, wherein the plates have a spherical curvature;
   wherein a drive unit for moving the plates is arranged outside a gas space (G); and
   wherein the multiplicity of the mobile plates is arranged inside the gas space (G).

35. An optical imaging device comprising a microlithographic projection objective, the device comprising:
   at least one system diaphragm, the system diaphragm comprising a multiplicity of mobile plates which are rotatably mounted, wherein the plates have a spherical curvature;
   wherein a drive unit for moving the plates is arranged outside a gas space (G); and
   wherein at least one of the multiplicity of the mobile plates is arranged inside the gas space (G).

36. An optical imaging device, in particular an objective for semiconductor lithography, having at least one system diaphragm, the system diaphragm comprising a multiplicity of mobile plates which are rotatably mounted, wherein the plates have a spherical curvature;
   wherein a drive unit for moving the plates is arranged outside a gas space (G); and
   wherein the at least one system diaphragm is arranged inside the gas space (G).

* * * * *